(12) United States Patent
Jin et al.

(10) Patent No.: US 11,715,396 B1
(45) Date of Patent: Aug. 1, 2023

(54) DISPLAY APPARATUS

(71) Applicant: SILICON DISPLAY TECHNOLOGY, Yongin-si (KR)

(72) Inventors: Jong Woo Jin, Seoul (KR); Jinhyeong Yu, Yongin-si (KR); Hyunwoo Kim, Yongin-si (KR); Jae Ho Shin, Yongin-si (KR)

(73) Assignee: SILICON DISPLAY TECHNOLOGY, Yongin-si (KR)

( * ) Notice: Subject to any disclaimer, the term of this patent is extended or adjusted under 35 U.S.C. 154(b) by 0 days.

(21) Appl. No.: 17/858,308

(22) Filed: Jul. 6, 2022

(30) Foreign Application Priority Data

Feb. 7, 2022 (KR) ........................ 10-2022-0015789

(51) Int. Cl.
*G09F 9/302* (2006.01)
*G06F 3/14* (2006.01)
*H10K 59/18* (2023.01)

(52) U.S. Cl.
CPC ........... *G09F 9/3026* (2013.01); *H10K 59/18* (2023.02); *G06F 3/1446* (2013.01)

(58) Field of Classification Search
CPC .............. G09G 9/3026; H01L 27/3293; G06F 3/1446
See application file for complete search history.

(56) References Cited

U.S. PATENT DOCUMENTS

| | | |
|---|---|---|
| 2004/0256977 A1 | 12/2004 | Aston |
| 2007/0001927 A1 | 1/2007 | Ricks et al. |
| 2011/0057861 A1 | 3/2011 | Cok et al. |
| 2015/0028316 A1* | 1/2015 | Kojima ............... H01L 51/0097 257/40 |
| 2015/0364070 A1 | 12/2015 | Lv et al. |
| 2016/0037608 A1 | 2/2016 | Ikeda et al. |
| 2018/0151539 A1* | 5/2018 | Nakamura .......... H01L 27/3267 |
| 2019/0198575 A1 | 6/2019 | Liu et al. |
| 2020/0251457 A1* | 8/2020 | Huang ................ H01L 25/0753 |

* cited by examiner

*Primary Examiner* — Kevin M Nguyen
(74) *Attorney, Agent, or Firm* — Lex IP Meister, PLLC

(57) ABSTRACT

A display apparatus according to an embodiment includes a plurality of display modules including a display region where a plurality of pixels are positioned and a non-display region outside the display region, wherein, for two display modules adjacent among a plurality of display modules to provide a continuous display region, the display region of the first display module among two adjacent display modules and the non-display region of the second display module among the two adjacent display modules overlap each other in a plane view.

19 Claims, 12 Drawing Sheets

DISPLAY APPARATUS

CROSS-REFERENCE TO RELATED APPLICATION

This application claims priority to and the benefit of Korean Patent Application No. filed in the Korean Intellectual Property Office on, the entire contents of which are incorporated herein by reference.

BACKGROUND (a) Field

An embodiment relates to a display apparatus.

(b) Description of the Related Art

As an information society develops, a demand for a display apparatus for displaying images is increasing in various forms. Such display apparatuses may be used as relatively small display devices such as TVs, monitors, and various personal portable digital devices, and may also be used as relatively large displays such as a public display and digital signage.

The above-described large display apparatus is generally disposed outdoors and is used for providing information to a plurality of users. Therefore, the large display apparatus needs to be implemented in a large area so that the users may easily recognize the information provided from the display apparatus even at a long distance.

When the display apparatus is manufactured in a large size using one base substrate, it is difficult to secure a yield above a certain level, so productivity or reliability may deteriorate. In order to solve this problem, a tile-type display apparatus that implements a single large-size screen by disposing a plurality of display apparatuses adjacently is used.

Since the tile-type display apparatus has a form in which a plurality of divided display apparatuses are combined with each other, a seam (or a joint) is present between adjacent display apparatuses. Since such a seam corresponds to a non-display part (or a bezel area) in which the image is not implemented, it gives a sense of a disconnection and/or heterogeneity to the user viewing the tile-type display apparatus, and significantly deteriorates image immersion.

The above information disclosed in this Background section is only for enhancement of understanding of the background, and therefore it may contain information that does not form the prior art that is already known in this country to a person of ordinary skill in the art.

SUMMARY

An embodiment aims to provide a more seamless large display apparatus.

In addition, the embodiment aims to provide a large display apparatus that is easy to be manufactured.

A display apparatus according to an embodiment for solving these technical objects includes a plurality of display modules including a display region where a plurality of pixels are positioned and a non-display region outside the display region, wherein, for two display modules adjacent among a plurality of display modules to provide a continuous display region, the display region of the first display module among two adjacent display modules and the non-display region of the second display module among the two adjacent display modules overlap each other in a plane view.

The first and second display modules may be bonded by a first adhesive member in the overlapping area, The first direction width of the overlapping region may be 20% or less of the first direction width of the display region of the second display module.

The first direction width of the overlapping area may be 3 mm or more,

The ratio of the sum of the thickness of the non-display region of the second display module and the thickness of the adhesive member to the first direction width of the display region of the first display module may be 10:1 or more.

The second display module may be positioned under the first display module.

The third display module among a plurality of display modules may be combined to the display region of the second display module to overlap each other on a plane, and is positioned under the second display module, and the first, second, and third display modules may be arranged along the first direction.

The third display module among a plurality of display modules may be combined with the non-display region of the second display module to overlap each other on a plane, the third display module is positioned on the second display module, and the first, second, and third display modules may be arranged along the first direction.

Each of a plurality of display modules may include: a first substrate where the display region and the non-display region are positioned; and a second substrate connected to the first substrate and including a driving unit generating a signal provided to a plurality of pixels.

The first substrate and/or the second substrate may be bent so that the second substrate is positioned on the back surface of the first substrate.

Each of a plurality of display modules may include a first cover supporting the first substrate on the back surface of the first substrate, and the first substrate of the first module may be positioned between the first cover of the first display module and the first cover of the second display module.

The distance between two adjacent pixels of the first display module and the distance between the pixel of the first display module and the pixel of the second display module adjacent to each other may be the same within a 5% error range.

The distance between the pixel of the first display module adjacent to the second display module and the boundary of the first display module adjacent to the second display module may be less than the distance between two adjacent pixels of the first display module.

Each of a plurality of display modules further includes a second cover positioned corresponding to the display region.

The areas of the first cover and the second cover may be different from each other.

The first direction lengths of the first cover and the second cover are the same as each other, and the second direction lengths intersecting the first direction may be different from each other.

The first cover and/or the second cover may be attached to the display module by a second adhesive member, and the first adhesive member and the second adhesive member may include the same material.

An optical member positioned between the second covers of the first and second display modules may be further included.

The optical member may include a resin or an optically clear adhesive (OCA).

A black matrix positioned correspondingly between the pixel of the first display module and the pixels of the second display module adjacent to each other may be further included.

A first window positioned corresponding to the entire display region of a plurality of display modules on a plurality of second covers may be further included, and the black matrix may be positioned on the first window.

A second window provided under a plurality of first covers may be further included.

A third cover positioned corresponding to the entire display region of a plurality of display modules may be further included.

The effect of the display apparatus according to the embodiment is described as follows.

According to at least one of the embodiments, there is a merit in that it is possible to provide a large display apparatus in which a sense of disconnection between a plurality of display apparatuses is removed.

Also, according to at least one of the embodiments, there is a merit that it may improve the immersion of the image.

DETAILED DESCRIPTION OF THE EMBODIMENTS

Figure 1:
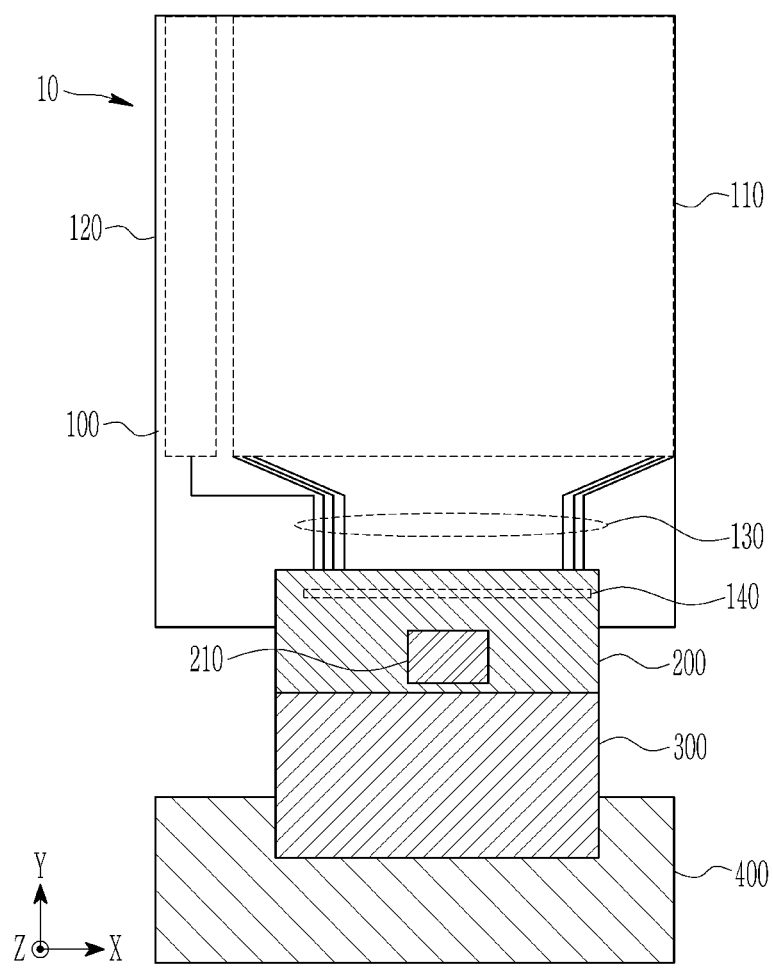
FIG. 1 is a top plan view of a display module included in a display apparatus according to a first embodiment.

In the following detailed description, only certain embodiments of the present invention have been shown and described, simply by way of illustration. As those skilled in the art would realize, the described embodiments may be modified in various different ways, all without departing from the spirit or scope of the present invention.

Further, the size and thickness of each of elements that are displayed in the drawings are described for better understanding and ease of description, and the present invention is not limited by the described size and thickness.

In the drawings, the thicknesses of layers, films, panels, regions, etc., are exaggerated for clarity. In addition, in the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise", and variations such as "comprises" or "comprising", will be understood to imply the inclusion of stated elements but not the exclusion of any other elements. Further, in the specification, the word "~on" means positioning above or below the object portion, but does not essentially mean positioning on the upper side of the object portion based on a gravity direction.

Hereinafter, a display module constituting a display apparatus according to an embodiment is described with reference to FIG. 1.

FIG. 1 is a top plan view of a display module included in a display apparatus according to a first embodiment. As shown in FIG. 1, a display module 10 includes a display panel 100, a first substrate 200 connected to the display panel 100, a second substrate 300 connected to the first substrate 200, and a third substrate 400 connected to the second substrate 300. The constituent elements shown in FIG. 1 are not essential in implementing the display module, so the following display module may have more or fewer constituent elements than the constituent elements listed above.

More specifically, among the constituent elements, the display panel 100 includes a plurality of pixels positioned in the display region 110 on the substrate and displaying an image, a driving unit 120 generating a scan signal to be transmitted to a plurality of pixels, a pad unit 140 for receiving a signal from the outside, and wiring 130 for transmitting a signal transmitted from the pad unit 140 to a plurality of pixels and the driving unit 120.

A plurality of pixels may be LED pixels. Each of a plurality of pixels may include a light-emitting element and a capacitor, a transistor, and the like for driving the light-emitting element. In addition, a plurality of pixels may be OLED pixels. That is, the light-emitting element included in each of a plurality of pixels may be an LED, an OLED, a mini LED, a micro LED, a QD LED, etc., and may further include a color conversion layer.

Two borders of the display region 110 may be positioned on two borders of the display panel 100 (referring to an upper border and a right border of the display region 110). That is, the non-display region is not positioned on two borders of the display panel 100.

The driving unit 120 may be positioned in the non-display region other than the display region 110. The driving unit 120 may change the level of the scan signal provided to the pixels to an enable level/disable level based on an applied clock signal, start pulse signal, and the like.

The driving unit 120 may include a transistor, a capacitor, etc. on the substrate of the display panel 100. The transistor included in the driving unit 120 and the transistor included in the display region 110 may be positioned on the same layer.

The wirings 130 may route between the pad unit 140 and the pixels and between the pad unit 140 and the driving unit 120.

The display panel 100 may be stretchable, flexible, bendable, and foldable.

The first substrate 200 may be connected to the pad unit 140 of the display panel 100 positioned in the non-display region. The first substrate 200 may be connected to the pad unit 140 of the display panel 100 positioned in the non-display region. The first substrate 200 may be a flexible printed circuit substrate (FPCB) or a chip on film (COF). Since the first substrate 200 may mount an integrated circuit chip 210, the first substrate 200 is described below as a chip-on-film (COF).

The integrated circuit chip 210 may be a data driving IC. The integrated circuit chip 210 may generate a data signal corresponding to a plurality of pixels to be transmitted to a plurality of pixels through the pad unit 140 and the wirings 130.

The first substrate 200 may be bent in the back direction of the display panel 100. When the first substrate 200 is bent, the integrated circuit chip 210 may be positioned on the back surface of the display panel 100.

The second substrate 300 may be connected to the first substrate 200. The second substrate 300 may be a flexible printed circuit substrate (FPCB) or a chip on film (COF). Since the second substrate 300 does not include an integrated circuit chip, the second substrate 300 is described below as a flexible printed circuit substrate (FPCB). Like the first substrate 200, the second substrate 300 may also be bent in the back surface direction of the display panel 100.

The third substrate 400 may be connected to the second substrate 300. The third substrate 400 may be a printed circuit substrate (PCB), but may also be a flexible printed circuit substrate (FPCB) or a chip-on-film (COF) depending on an embodiment. A signal control IC, a power management IC, etc. may be positioned on the third substrate 400. When the first substrate 200 and the second substrate 300 are bent, the third substrate 400 may be positioned on the back surface of the display panel 100.

Next, the display apparatus combined with the display module in FIG. 1 is described with reference to FIG. 2.

Figure 2:
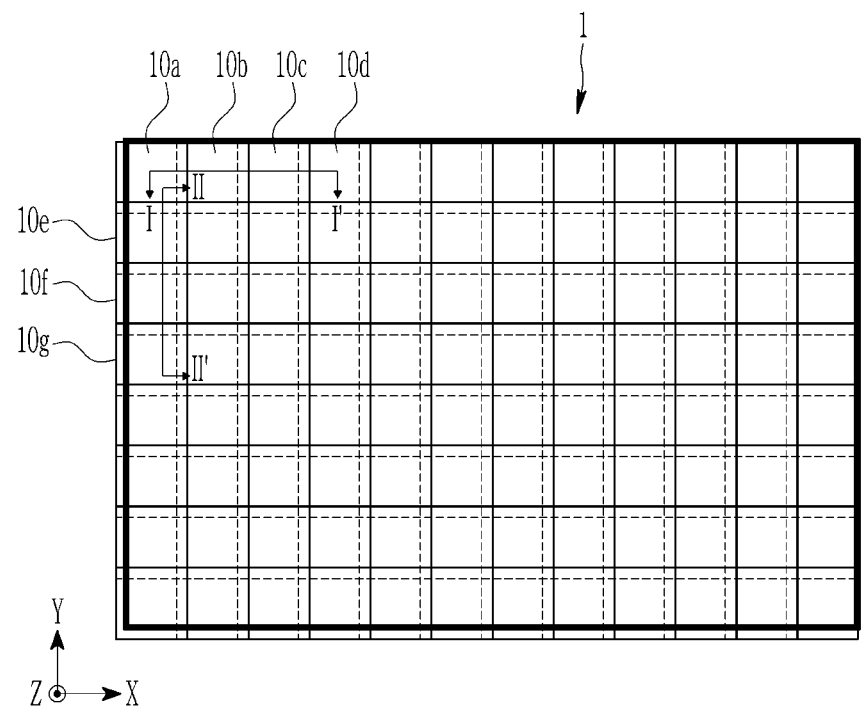
FIG. 2 is a top plan view of a display apparatus according to a first embodiment.

FIG. 2 is a top plan view of a display apparatus according to a first embodiment. As shown in FIG. 2, the display apparatus 1 may have a form in which a plurality of display modules 10a to 10g are combined in a matrix form. Each of the display modules 10a to 10g is partially attached to the non-display region of the adjacent display module. Accordingly, each of the display modules 10a to 10g may overlap the adjacent display module on a plane. The arrangement of the display modules 10a to 10g is described with reference to FIG. 3 to FIG. 5.

Figure 3:
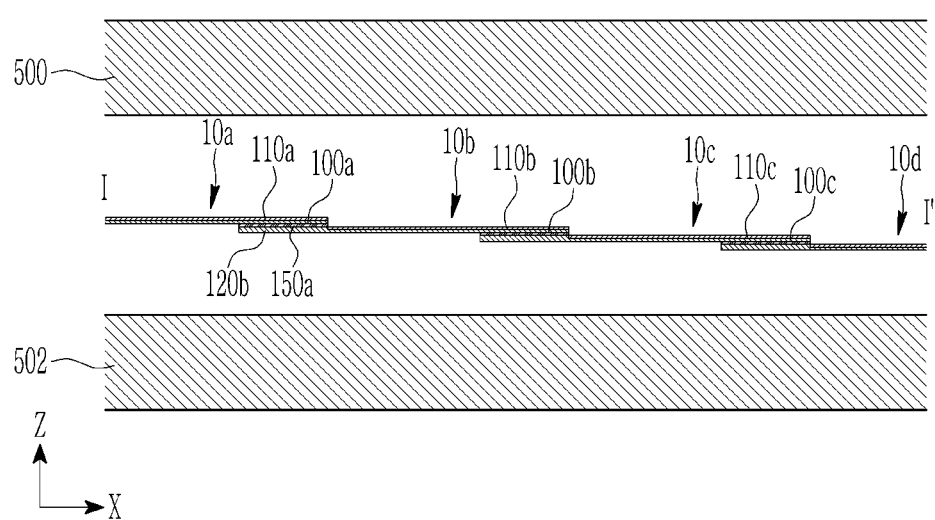
FIG. 3 is a cross-sectional view of a part of a display apparatus according to an aspect of a first embodiment.
Figure 4:
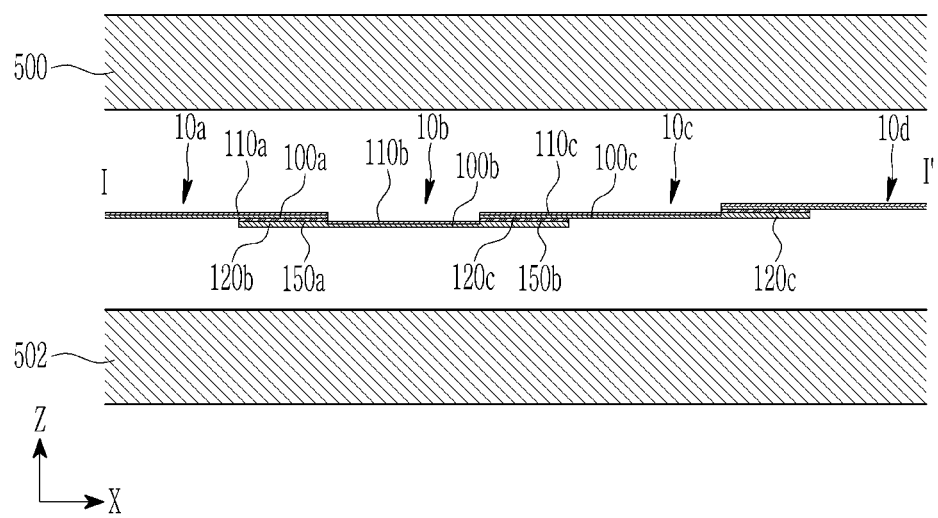
FIG. 4 is a cross-sectional view of a part of a display apparatus according to another aspect of a first embodiment.
Figure 5:
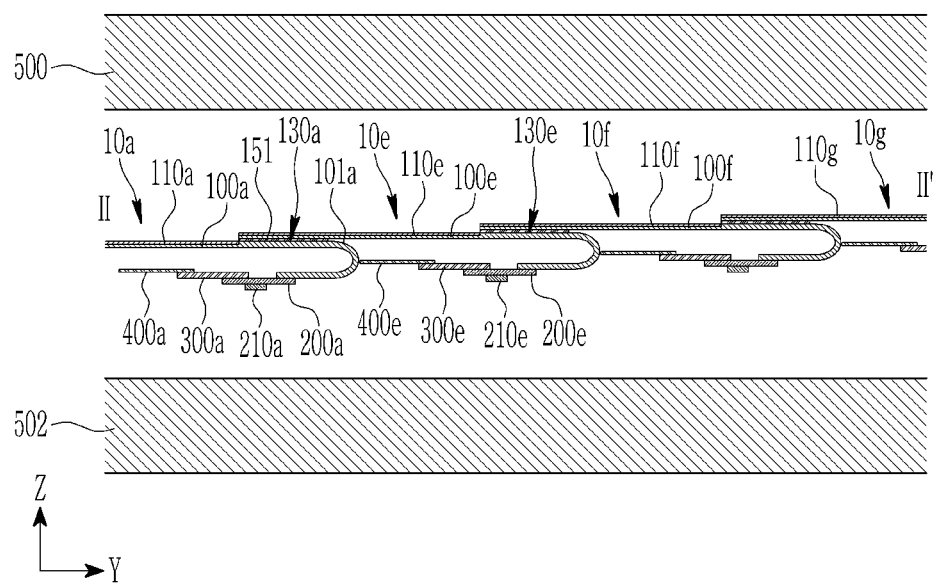
FIG. 5 is a cross-sectional view of another part of a display apparatus according to a first embodiment.

FIG. 3 is a cross-sectional view of a part of a display apparatus according to an aspect of a first embodiment, FIG. 4 is a cross-sectional view of a part of a display apparatus according to another aspect of a first embodiment, and FIG. 5 is a cross-sectional view of another part of a display apparatus according to a first embodiment.

As shown in FIG. 3, on the cross-section taken along a line I-I', a portion of the first display module 10a is attached to the second display module 10b, a portion of the second display module 10b is attached to the third display module 10c, and a portion of the third display module 10c is attached to the fourth display module 10d.

The display panel 100a may be positioned to overlap the non-display region of the display panel 100b so that the boundary of the display panel 100a and the boundary of the display region 110b coincide. The driving unit 120b of the display panel 100b may be positioned in the non-display region of the display panel 100b.

The display panel 100a may be attached to the display panel 100b as an adhesive member 150. The adhesive member 150 may include a resin or an optically clear adhesive (OCA), an adhesive film, a double-sided adhesive tape, and the like. Accordingly, the display region 110a on the substrate 100a and the display region 110b on the substrate 100b are seamlessly disposed along the x-axis direction.

For example, the x-axis direction width of the area where the display panel 100a and the display panel 100b overlap may be at least 3 mm, and may be less than or equal to 20% of the x-axis direction width of the display region 110b. This is to secure the area of the display region 110b while securing the minimum area for bonding two display panels 100a and 100b.

Similarly, the display panel 100b may be positioned to overlap the non-display region of the display panel 100c so that the boundary of the display panel 100b and the boundary of the display region 110c coincide. The driving unit 120c of the display panel 100c may be positioned in the non-display region of the display panel 100c.

The display modules 10a, 10b, 10c, and 10d along the x-axis direction may be sequentially disposed to have a step in the −z-axis direction. At this time, since two adjacent display modules among the display modules 10a, 10b, 10c, and 10d overlap each other, the step difference may occur between two adjacent display modules. However, the x-axis direction length of each of the display regions 110a and 110b is several cm to hundreds of cm, but the sum of the thicknesses of the display region 110b and the adhesive member 150 is several μm to hundreds of μm, so it has a ratio of approximately 10:1 to 100000:1 between the two. Therefore, the step difference between two adjacent display modules is not recognized by the user, and even if an additional member described below is attached to the front and/or back surfaces of the display modules 10a, 10b, 10c, and 10d, it is difficult to cause lifting between the display modules 10a, 10b, 10c, and 10d and the member.

To improve instrument strength, windows 500 and 502 can be additionally provided above and below the display modules 10a, 10b, 10c, and 10d. The windows 500 and 502 may be made of a material such as glass, polymethyl methacrylate (PMMA), acryl (acryl), and polyester (PET), but is not limited thereto.

The windows 500 and 502 may be attached to the front and back surfaces of the display modules 10a, 10b, 10c, and 10d, respectively.

As shown in FIG. 4, on the cross-section taken along a line I-I', a part of the first display module 10a is attached to the second display module 10b, a part of the third display module 10c is attached to the second display module 10b, and a part of the fourth display module 10d is attached to the third display module 10c.

The display panel 100a may be positioned to overlap the non-display region of the display panel 100b so that the boundary of the display panel 100a and the boundary of the display region 110b coincide. The driving unit 120b of the display panel 100b may be positioned in the non-display region of the display panel 100b.

The display panel 100a may be attached to the display panel 100b as an adhesive member 150a. Accordingly, the display region 110a on the display panel 100a and the display region 110b on the display panel 100b are seamlessly disposed along the x-axis direction.

The display panel 100c may be positioned to overlap the non-display region of the display panel 100b so that the boundary of the display panel 100c and the boundary of the display region 110b coincide. An additional driving unit may be positioned in the non-display region of the display panel 100b overlapping the display panel 100c.

The display panel 100c may be attached to the display panel 100b as an adhesive member 150b. Thus, the display region 110b on the display panel 100b and the display region 110c on the display panel 100c are seamlessly disposed along the x-axis direction.

If more than tens to hundreds of the display modules 10a, 10b, 10c, and 10d are connected along the x-axis direction, since it may be difficult to attach the windows 500 and 501 due to the step created in one direction (the z-axis direction or the −z-axis direction), the display modules 10a, 10b, 10c, and 10d may be disposed to have the step difference in the z-axis direction or the −z-axis direction along the x-axis direction.

As shown in FIG. 5, on the cross-section taken along a line II-II', a part of the first display module 10a is attached to the fifth display module 10e, a part of the fifth display module 10e is attached to the sixth display module 10f, and a part of the sixth display module 10f is attached to the seventh display module 10g.

The display panel 100e may be positioned to overlap the non-display region of the display panel 100a so that the boundary of the display panel 100e and the boundary of the display region 110a coincide. The wirings 130a of the display panel 100a may be placed in the non-display region of the display panel 100a overlapping the display panel 100e.

The display panel 100e may be attached to the display panel 100a as an adhesive member 151. Accordingly, the display region 110a on the display panel 100a and the display region 110e on the display panel 100e are seamlessly disposed along the y-axis direction.

The bending area 101a of the display panel 100a may be bent in the back surface direction of the display panel 100a. Then, the integrated circuit chip 210a, the first substrate 200a, the second substrate 300a, and the third substrate 400a may be positioned on the back surface of the display panel 100a. The third substrate 400a may be electrically connected to the third substrate 400e. In addition, the third substrate 400a and the third substrate 400e may be electrically connected to an external substrate (not shown) that controls the display apparatus 1 as a whole.

The display panel 100f may be positioned to overlap the non-display region of the display panel 100e so that the boundary of the display panel 100f and the boundary of the display region 110e coincide. In the non-display region of the display panel 100e, wirings 130e of the display panel 100e may be placed.

The display modules 10a, 10e, 10f, and 10g may be sequentially disposed along the y-axis direction to have a step difference in the z-axis direction. At this time, since two adjacent display modules among the display modules 10a, 10e, 10f, and 10g overlap each other, a step may occur between two adjacent display modules. However, the y-axis direction length of the display modules 10a, 10e, 10f, and 10g) is several cm to several hundred cm, but the sum of the thicknesses of the display panels 100a, 110e, 110f, and 110g and the adhesive member 151 is several μm to several tens of μm, so it has a ratio of approximately 10000:1 between the two. Therefore, the step difference between two adjacent display modules is not recognized by the user, and even if an additional member described below is attached to the front and/or back surface of the display modules 10a, 10e, 10f, and 10g, it is difficult to cause lifting between the display modules 10a, 10e, 10f, and 10g and the member.

To improve instrument strength, the windows 500 and 502 may be additionally provided above and below the display modules 10a, 10e, 10f, and 10g.

Next, a display apparatus according to a second embodiment is described with reference to FIG. 6 to FIG. 10.

Figure 6:
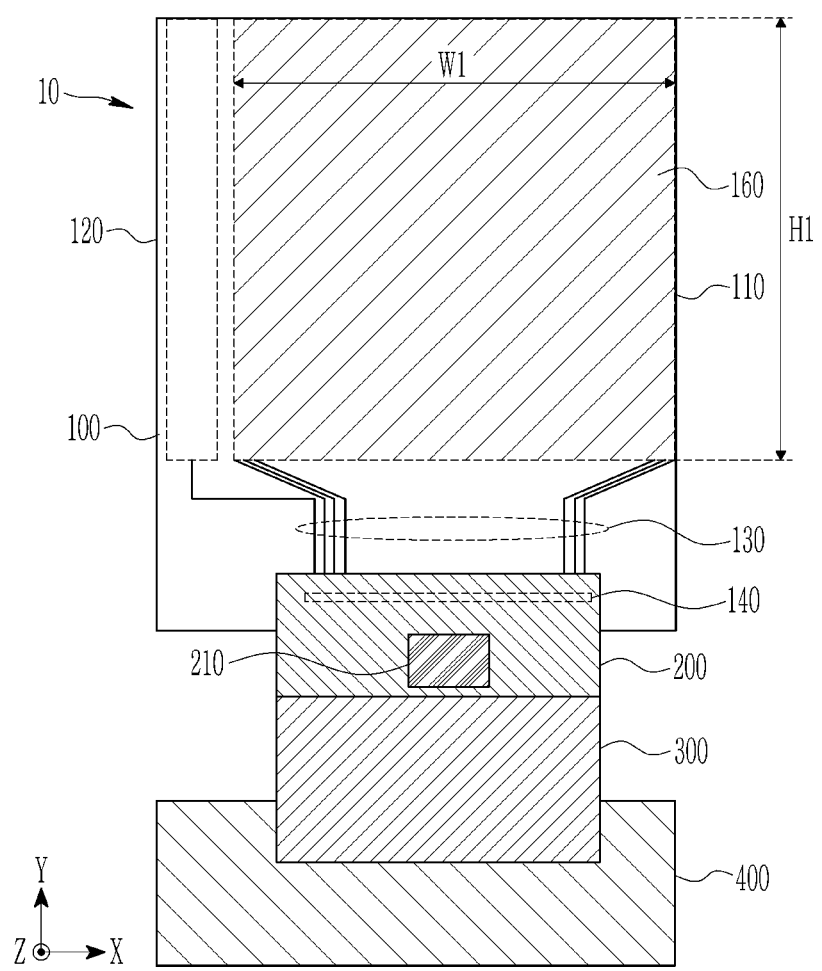
FIG. 6 is a top plan view of a display module included in a display apparatus according to a second embodiment.
Figure 7:
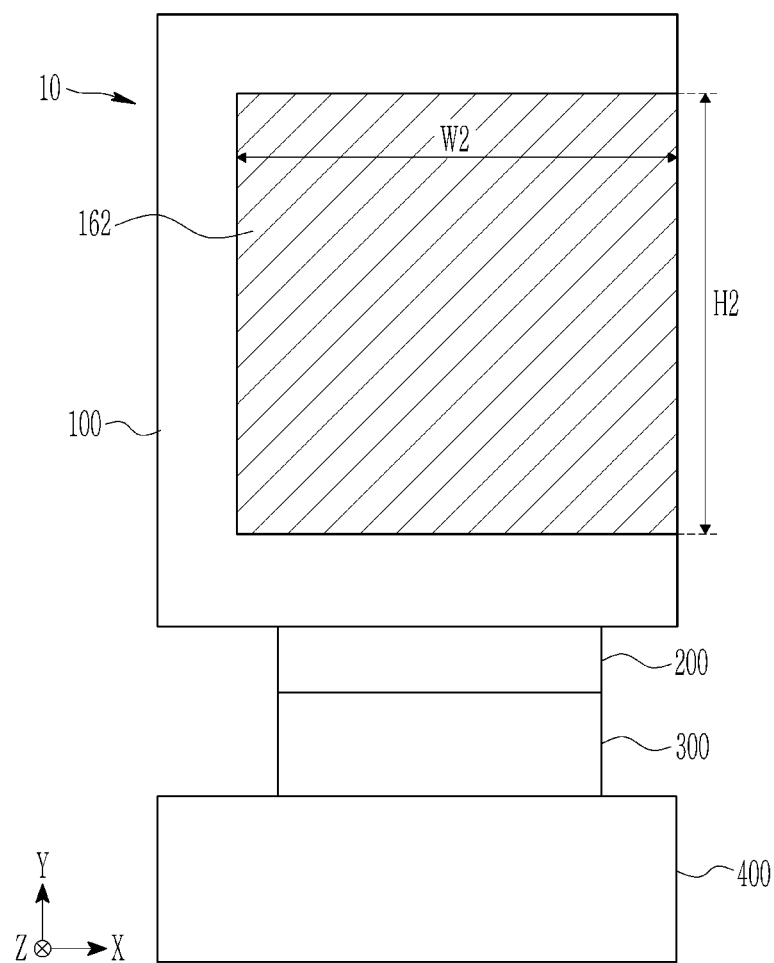
FIG. 7 is a rear view of a display module included in a display apparatus according to a second embodiment.

FIG. 6 is a top plan view of a display module included in a display apparatus according to a second embodiment, and FIG. 7 is a rear view of a display module included in a display apparatus according to a second embodiment.

As shown in FIG. 6, the display module 10 includes a display panel 100, a first substrate 200 connected to the display panel 100, a second substrate 300 connected to the first substrate 200, and a third substrate 400 connected to the second substrate 300. In the following, description of the constituent elements overlapping with the constituent elements described in FIG. 1 is omitted.

Compared to the display module included in the display apparatus according to the first embodiment, the display module 10 included in the display apparatus according to the present embodiment further includes a first cover 160 positioned on the display region 110 on the substrate. The first cover 160 may cover all or part of the display region 110.

As shown in FIG. 7, compared to the display module included in the display apparatus according to the first embodiment, the display module 10 included in the display apparatus according to the present embodiment is positioned on the back surface of the display panel 100 and further includes a second cover 162 supporting the display panel 100.

When connecting the display modules, the first covers 160 of two adjacent display modules may be positioned adjacent to each other, and the second covers 162 of each display module may also be positioned adjacent to each other.

Although the first cover 160 and the second cover 162 have been described as quadrangular in the above, the shape of the first cover 160 and the second cover 162 may be triangular, hexagonal, or the like.

The area of the first cover 160 may be greater than or equal to the area of the second cover 162. The x-axis direction length W1 of the first cover 160 may be greater than or equal to the x-axis direction length W2 of the second cover 162.

Also, the y-axis direction length H1 of the first cover 160 may be greater than the y-axis direction length H2 of the second cover 162. This is to prepare a space for accommodating the bent part when the display panel 100 is bent.

Next the display apparatus to which the display module in FIG. 6 and FIG. 7 is coupled is described with reference to FIG. 8.

Figure 8:
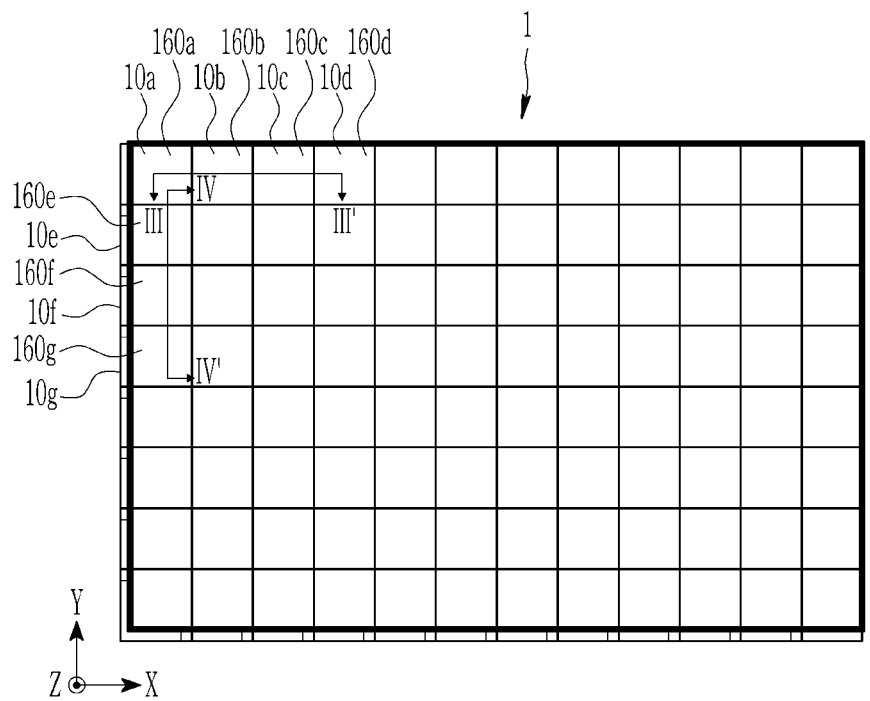
FIG. 8 is a top plan view of a display apparatus according to a second embodiment.

FIG. 8 is a top plan view of a display apparatus according to a second embodiment.

As shown in FIG. 8, a plurality of display modules 10a to 10g may be coupled in a matrix type. In addition, the first covers 160a to 160g attached to the front surface of a plurality of display modules 10a to 10g may also be disposed in a matrix form.

Each of the display modules 10a to 10g is partially attached to the non-display region of the adjacent display module. Therefore, each of the display modules 10a to 10g may be overlapped with the adjacent display module on a plane.

This is described with reference to FIG. 9 and FIG. 10.

Figure 9:
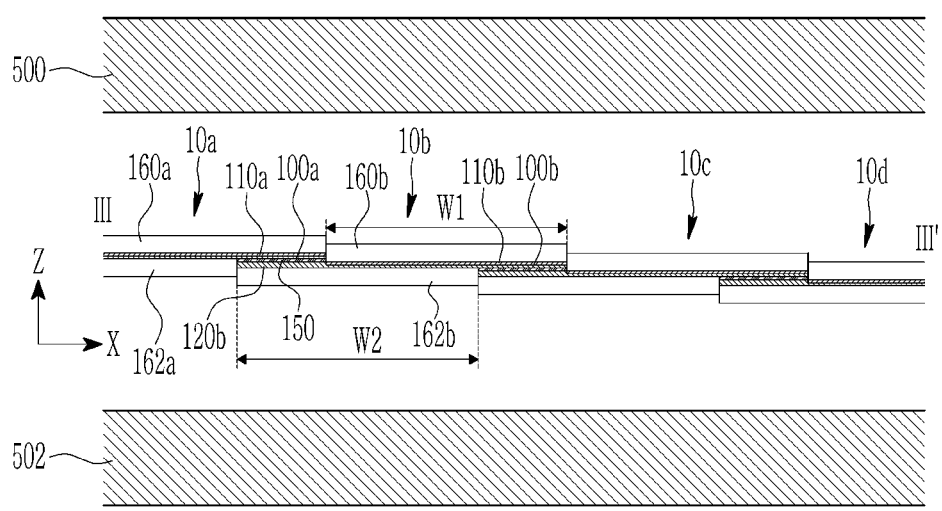
FIG. 9 is a cross-sectional view of a part of a display apparatus according to a second embodiment.
Figure 10:
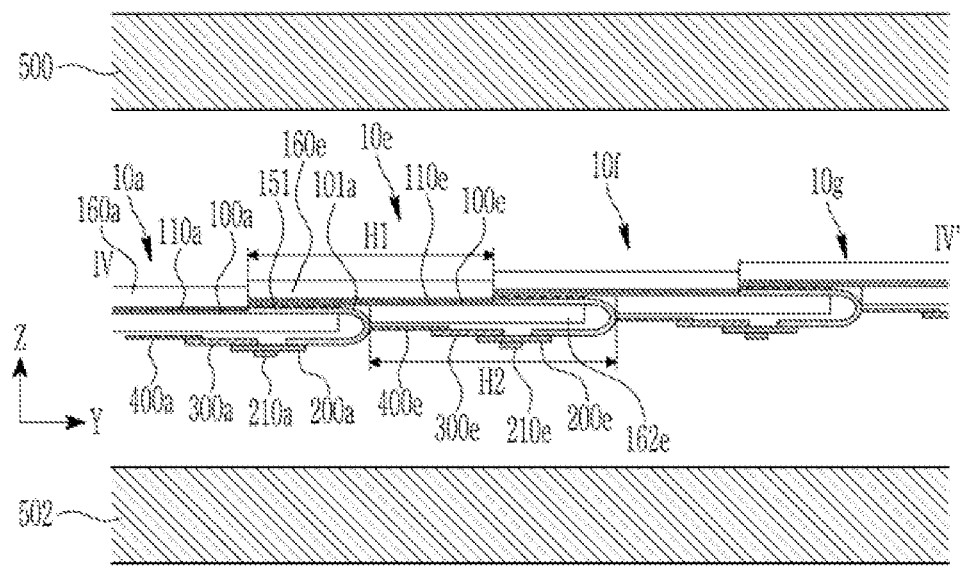
FIG. 10 is a cross-sectional view of another part of a display apparatus according to a second embodiment.

FIG. 9 is a cross-sectional view of a part of a display apparatus according to a second embodiment, and FIG. 10 is a cross-sectional view of another part of a display apparatus according to a second embodiment.

As shown in FIG. 9, on the cross-section taken along a line III-III', a part of the first module 10a is attached to the second module 10b, a part of the second module 10b is attached to the third module 10c, and a part of the third module 10c is attached to the fourth module 10d.

The display panel 100a may be positioned to overlap the non-display region of the display panel 100b so that the boundary of the display panel 100a and the boundary of the display region 110b coincide. The driving unit 120b of the display panel 100b may be positioned in the non-display region of the display panel 100b.

The first cover 160a and the first cover 160b may be positioned to be in contact with each other in the x-axis direction or to be spaced apart from each other at a predetermined interval. The first cover 160a and the first cover 160b may be attached to each other as an adhesive member. The second cover 162a and the second cover 162b may be positioned to be in contact with each other in the x-axis direction or to be spaced apart from each other at a predetermined interval. The second cover 162a and the second cover 162b may also be attached to each other as an adhesive member. Here, the x-axis direction length W1 of the first cover 160b may be the same as the x-axis direction length W2 of the second cover 162b.

The display panel 100a may be attached to the display panel 100b as an adhesive member 150. Accordingly, the display region 110a on the display panel 100a and the display region 110b on the display panel 100b are seamlessly disposed along the x-axis direction.

Similarly, the display panel 100b may be positioned to overlap the non-display region of the display panel (not shown) of the display module 10c so that the boundary of the display panel 100b coincides with the boundary of the display region (not shown) of the display module 10c. A driving unit (not shown) of the display module 10c may be positioned in the non-display region of the display panel (not shown) of the display module 10c.

The windows 500 and 502 may be additionally provided above and below the display modules 10a, 10b, 10c, and 10d to improve instrument strength. The windows 500 and 502 may be attached to the front surface of the first covers 160a, 160b, 160c, and 160d and the front surface of the first substrates 200a and 200b, the second substrates 300a and 300b, and the third substrates 400a and 400b, respectively.

As shown in FIG. 10, on the cross-section taken along a line IV-IV', a part of the first module 10a is attached to the fifth module 10e, a part of the fifth module 10e is attached to the sixth module 10f, and a part of the sixth module 10f is attached to the seventh module 10g.

The display panel 100e may be positioned to overlap the non-display region of the display panel 100a so that the boundary of the display panel 100e and the boundary of the display region 110a coincide. Wiring (not shown) of the display panel 100a may be positioned in the non-display region of the display panel 100a overlapping the display panel 100e.

The first cover 160a and the first cover 160e may be positioned to be spaced apart from each other at a predetermined interval in the y-axis direction. The first cover 160a and the first cover 160e may be attached to each other as an adhesive member. The second cover 162a and the second cover 162e may be positioned to be spaced apart from each other at a predetermined interval in the y-axis direction.

Here, the y-axis direction length H1 of the first cover 160e may be greater than the y-axis direction length H2 of the second cover 162e. Due to this difference in length, the bending area 101a of the display panel 100a may be bent. That is, the bent bending area 101a may be positioned between the second cover 162a and the second cover 162e.

The display panel 100e may be attached to the display panel 100a as an adhesive member 151. Accordingly, the display region 110a on the display panel 100a and the display region 110e on the display panel 100e are seamlessly disposed along the y-axis direction. The adhesive member 151 may be the same material as the adhesive used to adhere the first cover 160e and/or the second cover 162e to the display panel 100e. Also, in the process step of attaching the display panel 100a to the display panel 100e, the first cover 160e and/or the second cover 162e may be attached to the display panel 100e.

The bending area 101a of the display panel 100a may be bent in the back surface direction of the display panel 100a. Then, the integrated circuit chip 210a, the first substrate 200a, the second substrate 300a, and the third substrate 400a may be positioned on the back surface of the display panel 100a.

To improve the instrument strength, windows 500 and 502 may be additionally provided above and below the display modules 10a, 10e, 10f, and 10g. The windows 500 and 502 may be attached to the front surface of the first covers 160a, 160e, 160f and 160g and the front surface of the first substrates 200a and 200e, the second substrates 300a, and 300e, and the third substrates 400as and 400e, respectively.

Next, the display module of the display apparatus according to the third embodiment is described with reference to FIG. 11.

Figure 11:
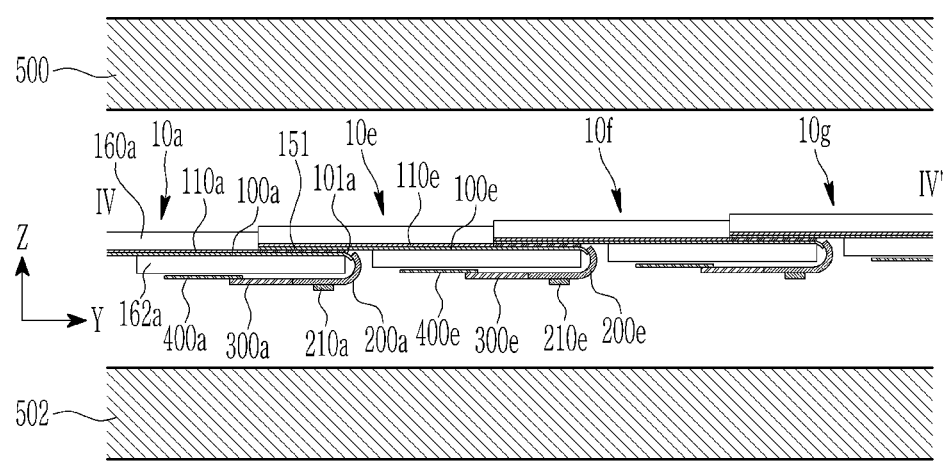
FIG. 11 is a cross-sectional view of a part of a display apparatus according to a third embodiment.

FIG. 11 is a cross-sectional view of a part of a display apparatus according to a third embodiment.

According to the third embodiment, the bending area 101a of the display panel 100a is bent in a shape to cover the side surface of the second cover 162a.

Referring to FIG. 11, since the first substrate 200a also has a flexible characteristic, the first substrate 200a may also be bent in the back surface direction of the display panel 100a. Then, the integrated circuit chip 210a, the first substrate 200a, the second substrate 300a, and the third substrate 400a may be positioned on the back surface of the display panel 100a.

According to the third embodiment, the bending area 101a of the display panel 100a and the first substrate 200a are bent so as to surround the side surface of the second cover 162a.

Next, a display apparatus according to a fourth embodiment is described with reference to FIG. 12 to FIG. 14.

Figure 12:
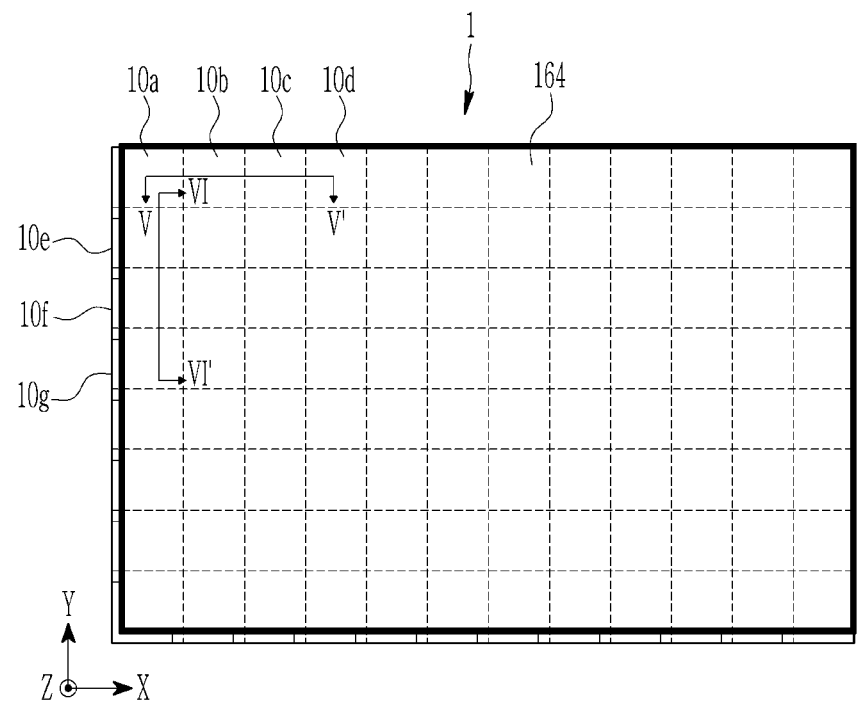
FIG. 12 is a top plan view of a display apparatus according to a fourth embodiment.

FIG. 12 is a top plan view of a display apparatus according to a fourth embodiment.

As shown in FIG. 12, a plurality of display modules 10a to 10g may be combined in a matrix form. Each of the display modules 10a to 10g is partially attached to the non-display region of the adjacent display module. Therefore, each of the display modules 10a to 10g may be overlapped with an adjacent display module on a plane.

A single cover 164 may be attached to the front surface of a plurality of the display modules 10a to 10g.

Hereinafter, the arrangement of the display modules 10a to 10g and the single cover 164 is described with reference to FIG. 13 and FIG. 14.

Figure 13:
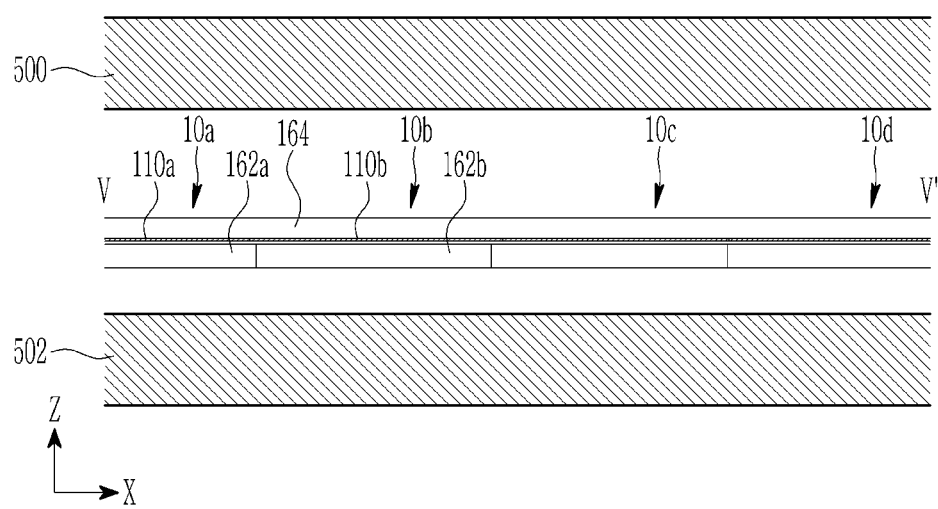
FIG. 13 is a cross-sectional view of a part of a display apparatus according to a fourth embodiment.
Figure 14:
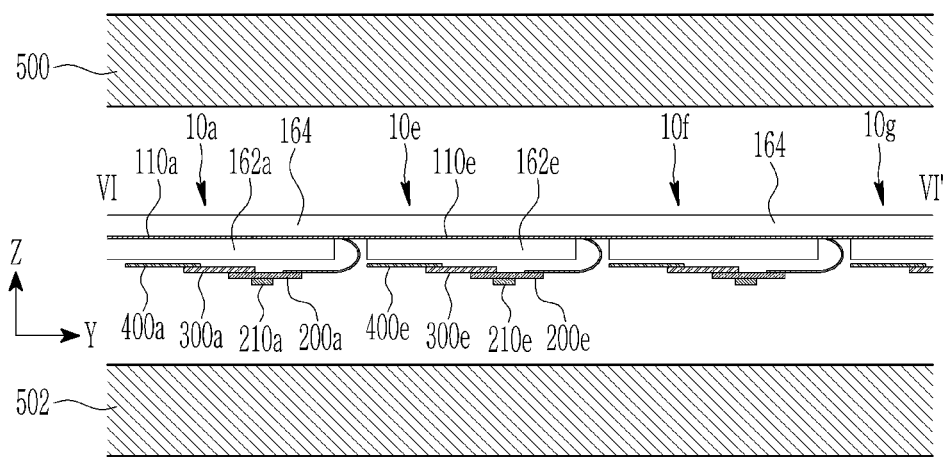
FIG. 14 is a cross-sectional view of another part of a display apparatus according to a fourth embodiment.

FIG. 13 is a cross-sectional view of a part of a display apparatus according to a fourth embodiment, and FIG. 14 is a cross-sectional view of another part of a display apparatus according to a fourth embodiment. In FIG. 13 and FIG. 14, the thickness of the display panel is omitted, and the same and similar parts as compared with one aspect of the first embodiment are omitted.

As shown in FIG. 13, on the cross-section taken along a line V-V', a part of the first module 10a is attached to the second module 10b, a part of the second module 10b is attached to the third module 10c, and a part of the third module 10c is attached to the fourth module 10d.

A single cover 160a may be attached to the front surface of the first to fourth display modules 10a to 10d. The second cover 162a and the second cover 162b may be positioned to be in contact with each other in the x-axis direction or to be spaced apart from each other at a predetermined interval. The second cover 162a and the second cover 162b may also be attached to each other as an adhesive member.

The windows 500 and 502 may be additionally provided above and below the display modules 10a, 10b, 10c, and 10d to improve the instrument strength. The windows 500 and 502 may be attached to the front surface of the front cover 164 and the front surface of the first substrates 200a and 200b, the second substrates 300a and 300b, and the third substrates 400a and 400b, respectively.

As shown in FIG. 14, on the cross-section taken along a line VI-VI', a part of the first module 10a is attached to the fifth module 10e, a part of the fifth module 10e is attached to the sixth module 10f, and a part of the sixth module 10f is attached to the seventh module 10g.

The single cover 160a may be attached to the front surface of the first to fourth display modules 10a to 10d. The second cover 162a and the second cover 162e may be positioned to be spaced apart from each other at a predetermined interval in the y-axis direction.

The integrated circuit chip 210a, the first substrate 200a, the second substrate 300a, and the third substrate 400a may be positioned on one surface of the second cover 162e.

The windows 500 and 502 may be additionally provided above and below the display modules 10a, 10e, 10f, and 10g to improve the instrument strength. The windows 500 and 502 may be attached to the front surface of the front cover 164 and the front surface of the first substrates 200a and 200e, the second substrates 300a and 300e, and the third substrates 400a and 400e, respectively.

Next, the position of the display region in the display panel is described with reference to FIG. 15 and FIG. 16.

Figure 15:
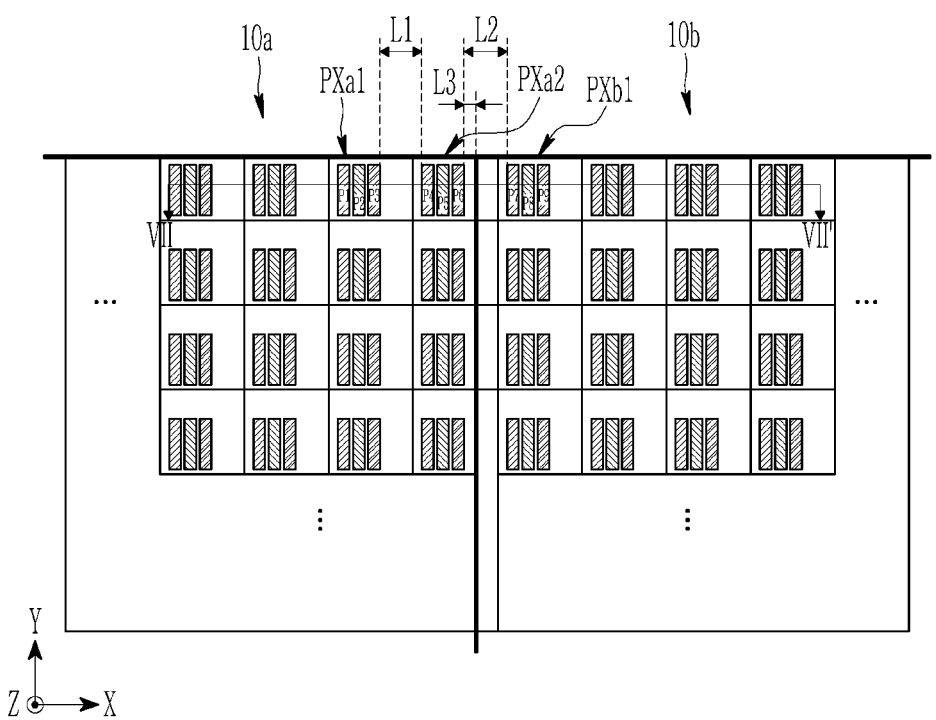
FIG. 15 is a top plan view of a part of a display apparatus according to a fifth embodiment.
Figure 16:
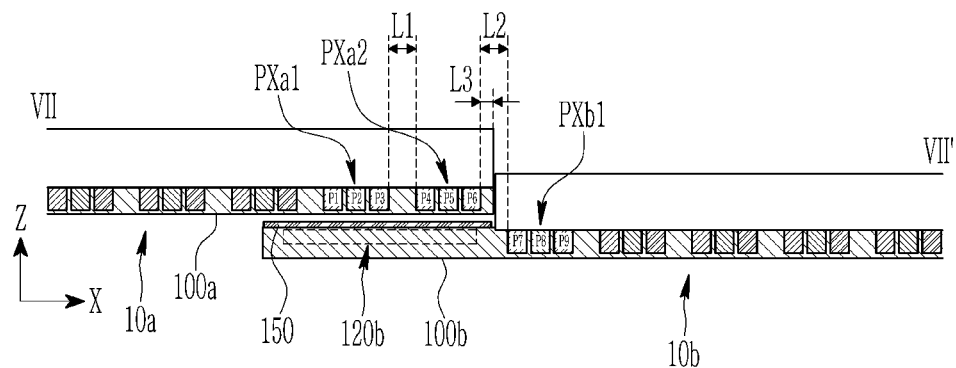
FIG. 16 is a cross-sectional view of a part of a display apparatus according to a fifth embodiment.

FIG. 15 is a top plan view of a part of a display apparatus according to a fifth embodiment, and FIG. 16 is a cross-sectional view of a part of a display apparatus according to a fifth embodiment.

Referring to FIG. 15, a plurality of pixels PXa1, PXa2, . . . are positioned in the display region 110a of the display module 10a, and each of the pixels PXa1 and PXa2 includes at least one sub-pixel P1, . . . , P6. Similarly, a plurality of pixels PXb1, . . . are positioned in the display panel 100b of the display module 10b, and each pixel PXb1 includes at least one sub-pixel P7, P8, and P9.

Referring to FIG. 16, a part of the display module 10a may be attached to the non-display region of the display module 10b through the adhesive member 150. The driving circuit 120b may be positioned in the non-display region of the display module 10b.

The x-axis direction distance between a plurality of pixels PXa1 and PXa2 is L1. The x-axis direction distance between the pixel PXa2 of the display module 10a and the pixel PXb1 of the adjacent display module 10b is L2. Here, L1 and L2 may be the same.

The x-axis direction distance from the pixel PXa2 of the display module 10a to the boundary between the display panel 100a is L3. Here, L3 may be less than L1. That is, by disposing the pixel PXa2 close to the boundary of the display panel 100a, the distance between the adjacent pixels (PXa2 and PXb1/PXa1 and PXa2) may be constant even when two adjacent display modules 10a and 10b are combined.

When the display panel is an OLED display panel, if a TFE (thin film encapsulation) type of encapsulation is formed, the area required for encapsulation at the boundary of the display panel 100a is only within a few μm to several tens of μm, so the TFE region may be positioned within the region having the length of L3 that is smaller than L1. The pixel PXa2 may be positioned close to the border of the display panel 100a.

If the display panel is a micro LED display panel, there is no big problem in a lifespan even if the LED, which is a light-emitting element, is exposed to the air, so there is no need for an encapsulation member, so the pixel PXa2 may be positioned close to the border of the display panel 100a. In this case, like the first embodiment, the first cover, the front cover, the like may be omitted, however like the second embodiment, the first cover may be attached on the display panel, or like the third embodiment, the front cover may be attached on the display panel to protect the light-emitting element.

Next, a black matrix for preventing visibility of the gap between the adjacent first covers is described with reference to FIG. 17 to FIG. 19.

Figure 17:
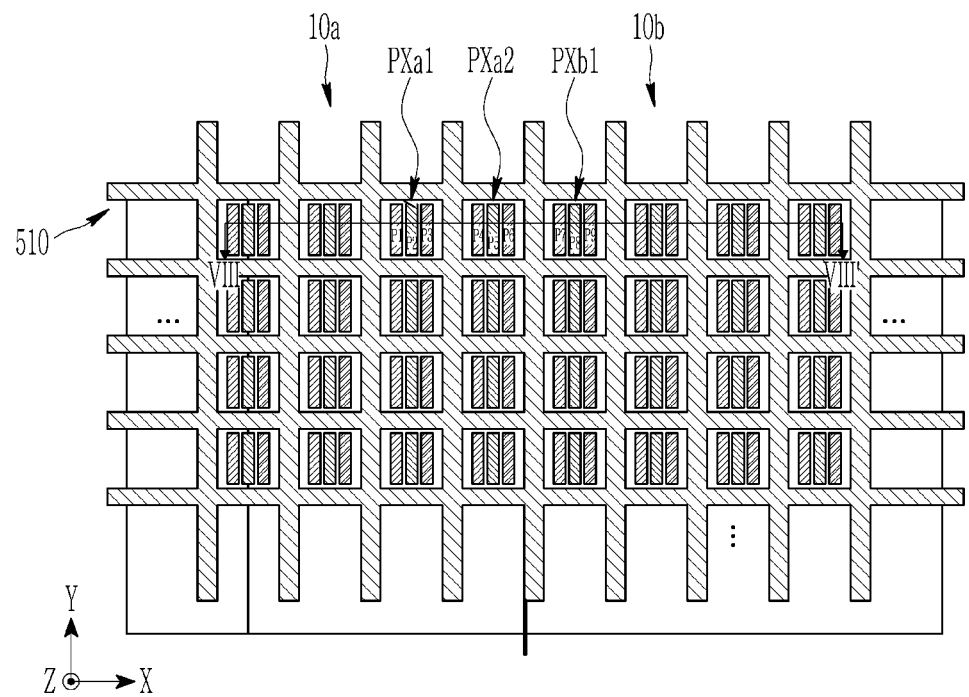
FIG. 17 is a top plan view of a part of a display apparatus according to a sixth embodiment.
Figure 18:
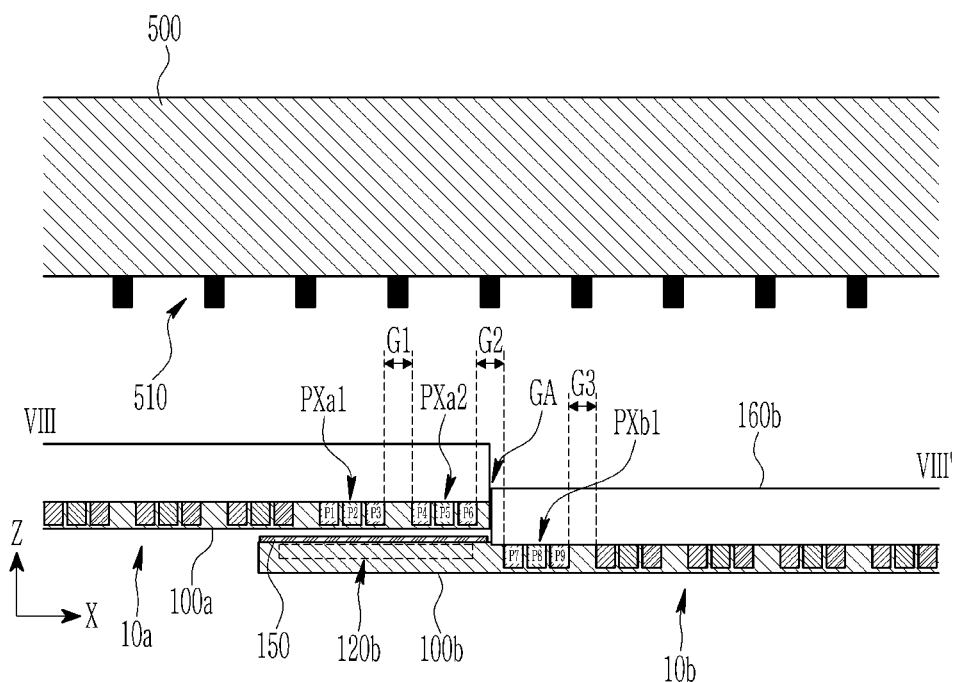
FIG. 18 is a cross-sectional view of a part of a display apparatus according to a sixth embodiment.

FIG. 17 is a top plan view of a part of a display apparatus according to a sixth embodiment, and FIG. 18 is a cross-sectional view of a part of a display apparatus according to a sixth embodiment.

Referring to FIG. 17, a black matrix 510 is disposed on the front surface of the display modules 10a and 10b.

Referring to FIG. 18, the black matrix 510 is positioned on one surface of the window 500. Then, the black matrix 510 is positioned in regions G1, G2, and G3 between the pixels PXa1, PXa2, and PXb1. Since the black matrix 510 is positioned to correspond to the gap GA between the adjacent first covers 160a and 160b, it is possible to prevent the gap G2 between the first covers 160a and 160b from being recognized.

Figure 19:
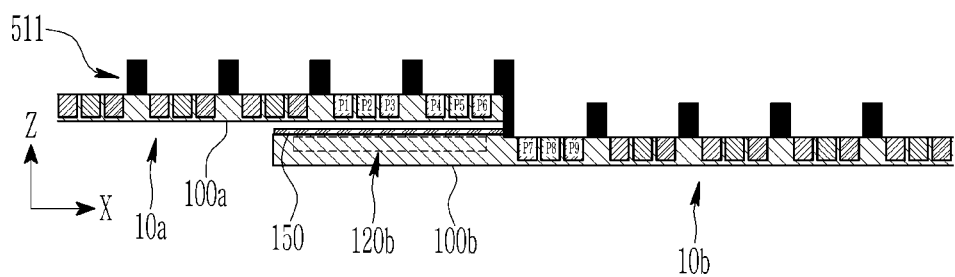
FIG. 19 is a cross-sectional view of a part of a display apparatus according to a seventh embodiment.

FIG. 19 is a cross-sectional view of a part of a display apparatus according to a seventh embodiment.

Referring to FIG. 19, the black matrix 511 is positioned on the display panels 100a and 100b. Then, the black matrix 511 is positioned in the area between the pixels PXa1, PXa2, and PXb1. Since the black matrix 511 is positioned to correspond between the adjacent display panels 100a and 100b, it is possible to prevent a step difference between the display panels 100a and 100b from being recognized.

Next, an optical member for preventing the recognition of the gap between adjacent first covers is described with reference to FIG. 20 and FIG. 21.

Figure 20:
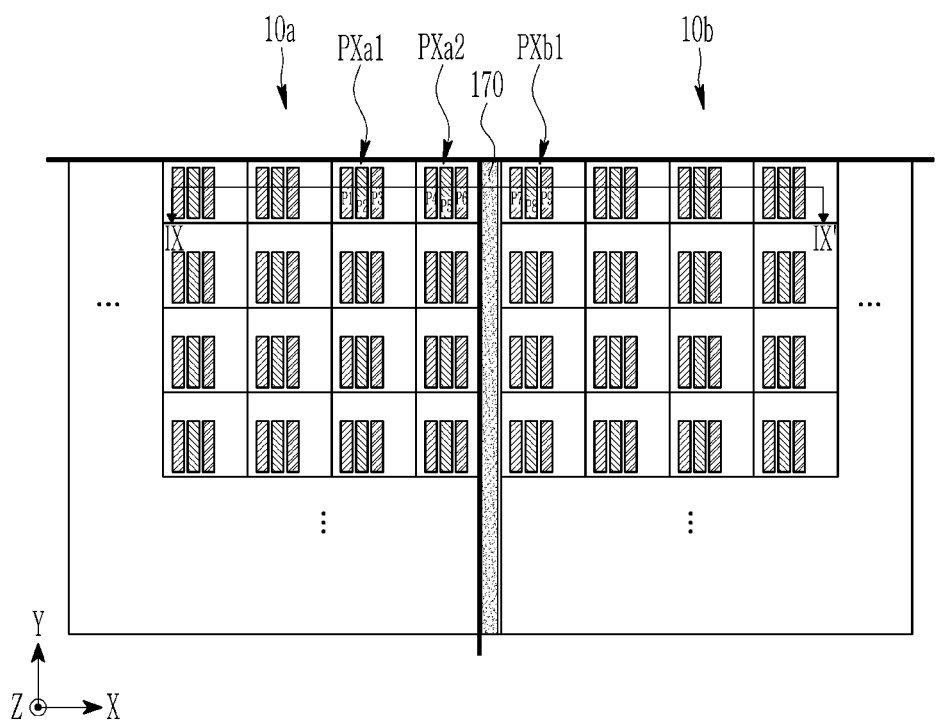
FIG. 20 is a top plan view of a part of a display apparatus according to an eighth embodiment.
Figure 21:
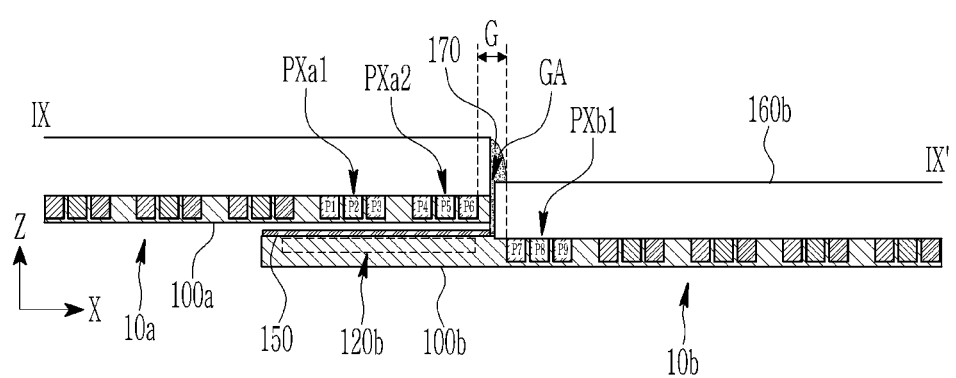
FIG. 21 is a cross-sectional view of a part of a display apparatus according to an eighth embodiment.

FIG. 20 is a top plan view of a part of a display apparatus according to an eighth embodiment, and FIG. 21 is a cross-sectional view of a part of a display apparatus according to an eighth embodiment.

Referring to FIG. 20, the optical member 170 is positioned between the display modules 10a and 10b.

Referring to FIG. 21, since the optical member 170 is positioned in the gap GA between the adjacent first covers 160a and 160b, it is possible to prevent the gap GA between the first covers 160a and 160b from being recognized. The refractive index of the optical member 170 may be substantially the same as that of the first covers 160a and 160b. The optical member 170 may be a resin or optically clear adhesive.

According to at least one of the embodiments of the present disclosure, a sense of the disconnection between a plurality of the display apparatus may be removed, and a seamless large display apparatus may be implemented, thereby improving immersion of an image.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display apparatus comprising a plurality of display modules including a display region where a plurality of pixels are positioned and a non-display region outside the display region,
    wherein, for two display modules adjacent among the plurality of display modules to provide a continuous display region, the display region of a first display module among the two adjacent display modules and the non-display region of a second display module among the two adjacent display modules overlap each other in a plane view,
    wherein the first and second display modules are bonded by a first adhesive member in an overlapping area between the first display module and the second display module; and
    wherein a ratio of a sum of a thickness of the non-display region of the second display module and a thickness of the adhesive member to a first direction width of the display region of the first display module is 10:1 or more.

2. The display apparatus of claim 1, wherein
    the first direction width of the overlapping area is 20% or less of the first direction width of the display region of the second display module.

3. The display apparatus of claim 2, wherein
    the first direction width of the overlapping area is 3 mm or more.

4. The display apparatus of claim 1, wherein
    the second display module is positioned under the first display module.

5. The display apparatus of claim 4, wherein
    a third display module among a plurality of display modules is coupled to the display region of the second display module to overlap each other on a plane, and is positioned under the second display module, and
    the first, second, and third display modules are arranged along the first direction.

6. The display apparatus of claim 5, wherein
    the third display module among a plurality of display modules is combined with the non-display region of the second display module to overlap each other on a plane, the third display module is positioned on the second display module, and
    the first, second, and third display modules are arranged along the first direction.

7. A display apparatus comprising a plurality of display modules including a display region where a plurality of pixels are positioned and a non-display region outside the display region,
    wherein, for two display modules adjacent among the plurality of display modules to provide a continuous display region, the display region of a first display module among the two adjacent display modules and the non-display region of the second display module among the two adjacent display modules overlap each other in a plane view,
    wherein each of the plurality of display modules includes:
    a first substrate where the display region and the non-display region are positioned; and
    a second substrate connected to the first substrate and including a driving unit generating a signal provided to the plurality of pixels;
    wherein at least one of the first substrate and the second substrate is bent so that the second substrate is positioned on a back surface of the first substrate; and
    wherein
    each of the plurality of display modules includes a first cover supporting the first substrate on the back surface of the first substrate,
    the first substrate of the first display module is positioned between the first cover of the first display module and the first cover of the second display module.

8. The display apparatus of claim 7, wherein
    a distance between two adjacent pixels of the first display module and a distance between the pixel of the first display module and the pixel of the second display module adjacent to each other are the same within a 5% error range.

9. The display apparatus of claim 8, wherein
    the distance between the pixel of the first display module adjacent to the second display module and the boundary of the first display module adjacent to the second display module is less than the distance between two adjacent pixels of the first display module.

10. The display apparatus of claim 8, wherein
    each of a plurality of display modules further includes a second cover positioned corresponding to the display region.

11. The display apparatus of claim 10, wherein
    areas of the first cover and the second cover are different from each other.

12. The display apparatus of claim 11, wherein
    first direction lengths of the first cover and the second cover are the same as each other, and second direction lengths intersecting the first direction are different from each other.

13. The display apparatus of claim 10, wherein
    the first cover and/or the second cover are attached to the display module by a second adhesive member, and
    the first adhesive member and the second adhesive member includes the same material.

14. The display apparatus of claim 10, further comprising
    an optical member positioned between the second covers of the first and second display modules.

15. The display apparatus of claim 14, wherein
    the optical member includes a resin or an optical clear adhesive (OCA).

16. The display apparatus of claim 8, further comprising a black matrix positioned correspondingly between the pixel of the first display module and the pixels of the second display module adjacent to each other.

17. The display apparatus of claim 16, further comprising a first window positioned corresponding to the entire display region of a plurality of display modules on a plurality of second covers, and the black matrix is positioned on the first window.

18. The display apparatus of claim 8, further comprising a second window provided under a plurality of first covers.

19. The display apparatus of claim 8, further comprising a third cover positioned corresponding to the entire display region of a plurality of display modules.

* * * * *